United States Patent [19]

Giammaruti

[11] Patent Number: 5,579,830

[45] Date of Patent: Dec. 3, 1996

[54] PASSIVE COOLING OF ENCLOSURES USING HEAT PIPES

[75] Inventor: Robert J. Giammaruti, North Canton, Ohio

[73] Assignee: Hudson Products Corporation, Houston, Tex.

[21] Appl. No.: 563,872

[22] Filed: Nov. 28, 1995

[51] Int. Cl.⁶ ..................................................... F28D 15/00
[52] U.S. Cl. ................................ 165/104.27; 165/104.21; 165/104.33; 165/135; 165/279; 62/333
[58] Field of Search ......................... 165/104.33, 104.27, 165/104.26, 104.21, 32, 10, 135; 62/333

[56] References Cited

U.S. PATENT DOCUMENTS

| | | | |
|---|---|---|---|
| 2,499,736 | 3/1950 | Kleen | 165/104.21 X |
| 4,285,027 | 8/1981 | Mori et al. | 165/104.21 X |
| 4,582,125 | 4/1986 | Bäur et al. | 165/104.21 X |
| 4,976,308 | 12/1990 | Faghri | 165/10 |
| 5,159,972 | 11/1992 | Gunnerson et al. | 165/104.21 X |

Primary Examiner—Stephen M. Hepperle
Assistant Examiner—Christopher Atkinson
Attorney, Agent, or Firm—Michael L. Hoelter; Robert J. Edwards

[57] ABSTRACT

A cooling system for passively cooling an enclosure incorporating at least one inclined heat pipe having an evaporator side extending within the enclosure and a condenser side extending outside the enclosure in contact with the ambient environment. A thermal storage device within the enclosure is configured having a first portion extending adjacent the evaporator side of the heat pipe and a second portion extending within, and generally concentric with, the evaporator side of the heat pipe. A solid-to-liquid phase change material is sealed within this thermal storage device such that this material changes to a liquid upon the absorption of heat. To further enhance the transfer of heat from within the enclosure to outside the enclosure, a series of fins can be added to the first portion of the thermal storage device as well as to the condenser side of the heat pipe. Additionally, a series of internal fins can be mounted to the second portion of the thermal storage device which would preferably be submerged in the working fluid contained within the evaporator side of the heat pipe.

9 Claims, 2 Drawing Sheets

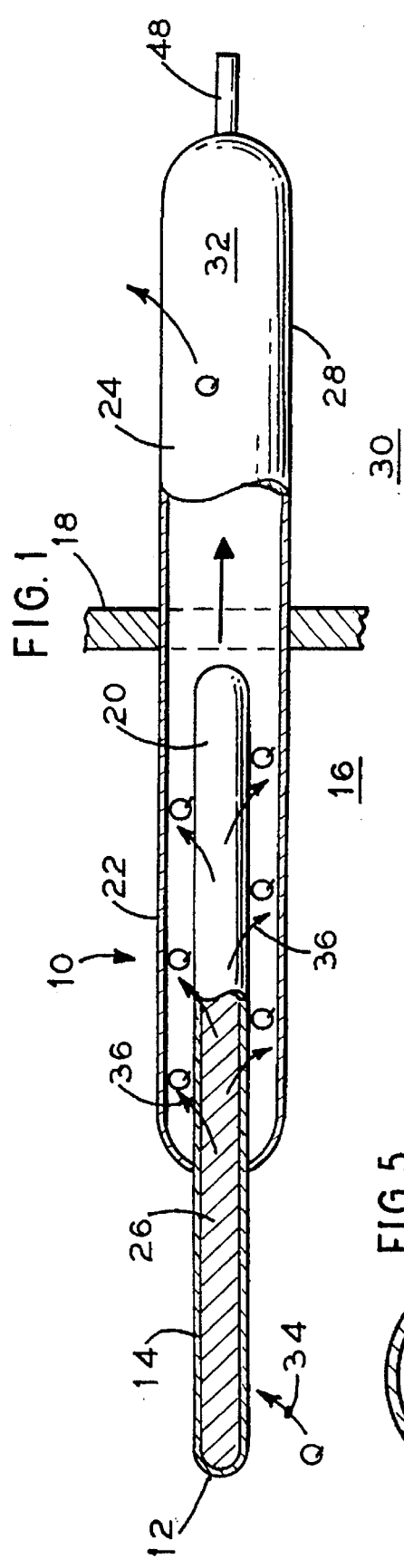
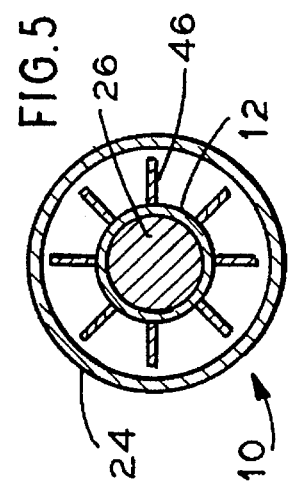
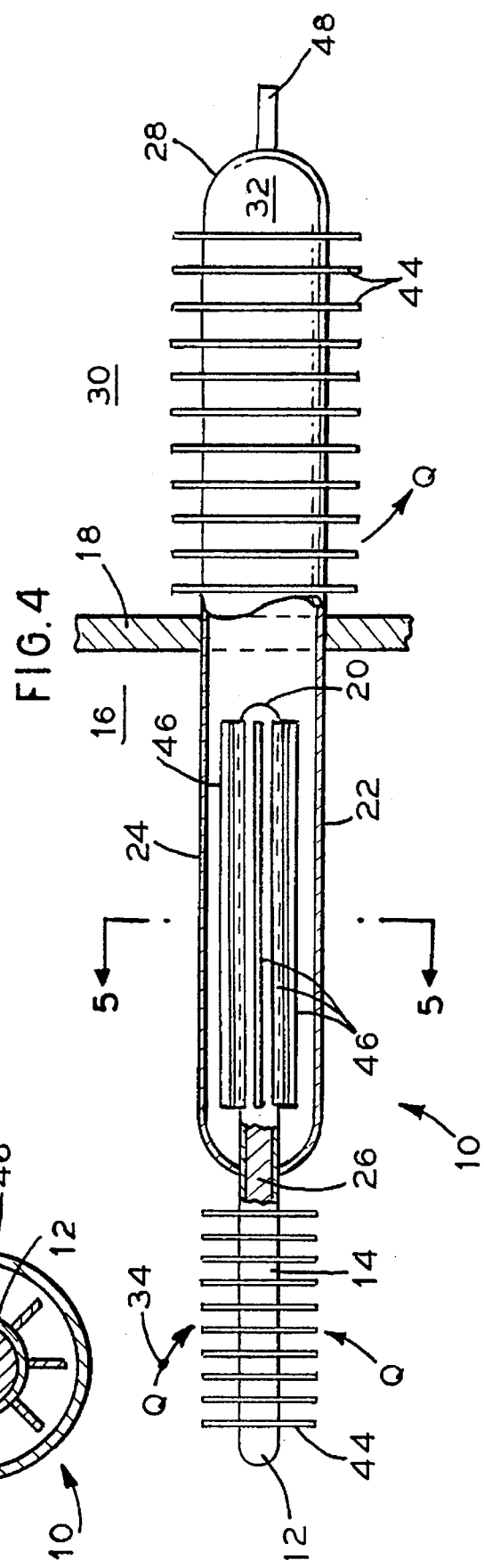

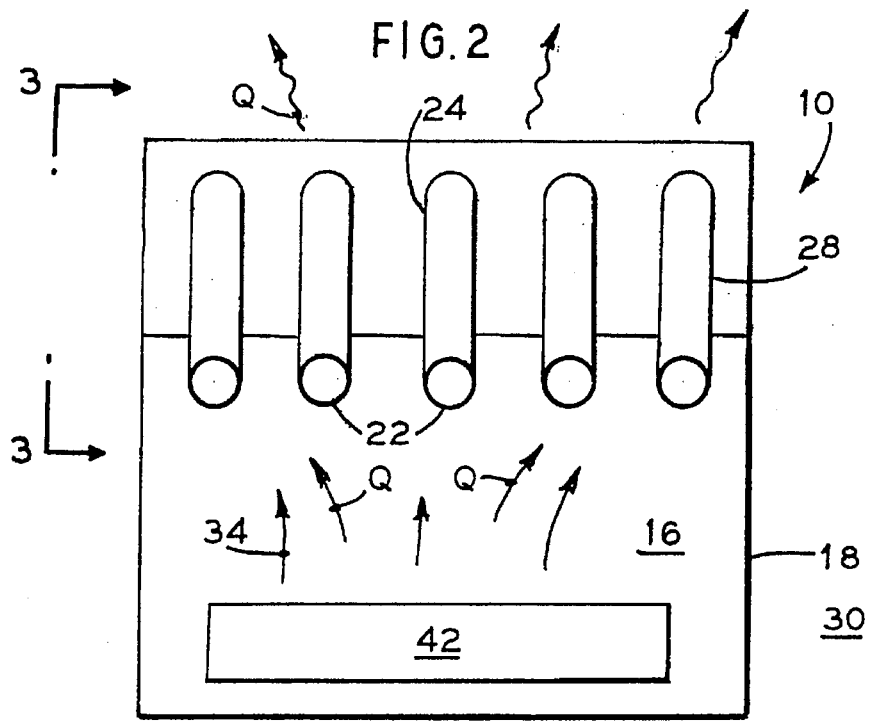
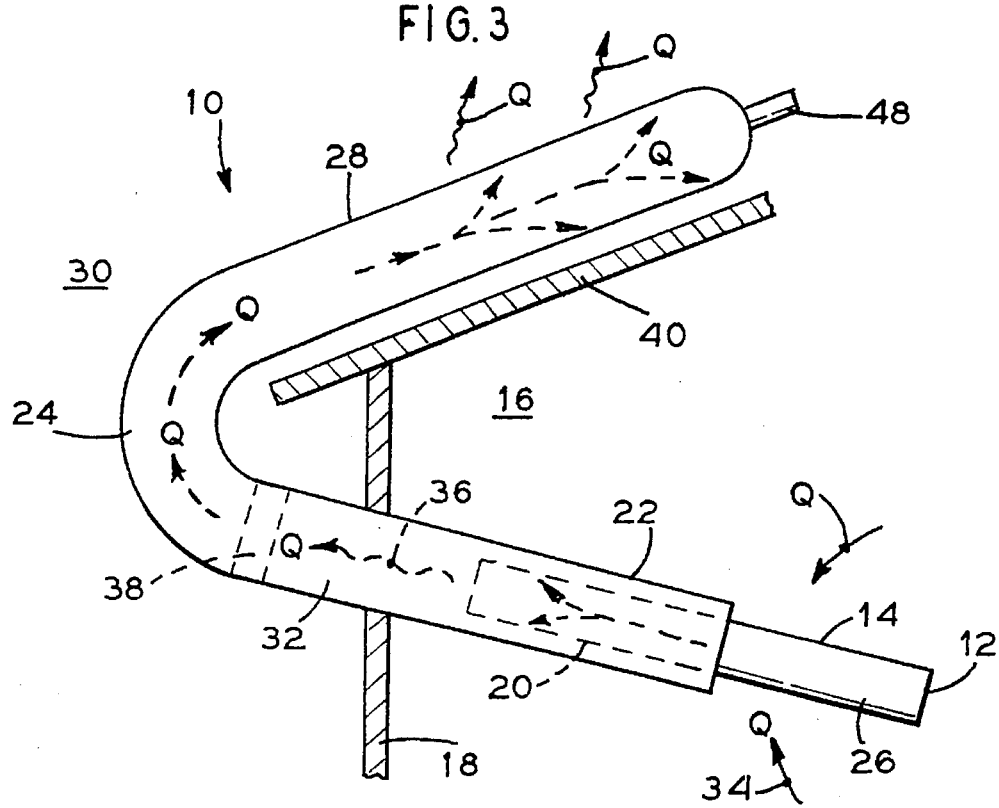

5,579,830

PASSIVE COOLING OF ENCLOSURES USING HEAT PIPES

FIELD OF THE INVENTION

This invention pertains to a manner of heat exchange in general and more particularly to a passive means of cooling an enclosure by using a plurality of heat pipes.

BACKGROUND OF THE INVENTION

It is common to house machines, including electronic communication and computing equipment, in buildings or enclosures to protect them from the elements. However, in many instances, these machines generate heat and since it is desirable to operate such machinery only within a certain limited temperature range, this heat must be removed from the enclosure in order to avoid any adverse consequences. Furthermore, such a need for cooling is not limited solely to machines, since buildings or enclosures that house people or animals must also be cooled in order to avoid the consequences of too much heat.

One method used to achieve such cooing (and a manner employed for quite a number of years) is to force a cooling fluid, such as air, over the heat source thereby cooling the source. Of course, to avoid heat build-up within the enclosure, such cooling fluid must also be forced or vented from the enclosure.

In those cases where it is desirable for the enclosure or the equipment to remain isolated from the ambient environment, heat exchangers are needed to transfer the heat generated within the enclosure to the cooling fluid (air) outside the enclosure. In the past, these types of heat exchangers, such as shell and tube, plate, heat pipe, etc., have been employed to separately transfer the heat between the enclosed heat source and the outside cooling medium. However, in order to operate properly, these types of heat exchangers use one or more fans to force air across their surfaces. In severe cases where such simple cooling by fans is not acceptable, such as in areas of high ambient temperature, heat is removed from such enclosures by a traditional refrigeration cycle. However, both this refrigeration method and the fan-cooled method described above require a power hook-up along with many moving parts and motors for operation. Since, in some cases, power is not available at the enclosure or access to replacement parts is difficult to obtain, such methods of cooling cannot be employed. In these cases, passive cooling systems that contain no moving parts and which require no external power source are desirable in order to maintain the optimum enclosure temperature.

It is thus an object of this invention to provide a passive cooling system that does not require an outside power source for operation. Another object of this invention is to provide a passive cooling system that has no moving mechanical parts which require routine maintenance and repair. Yet another object of this invention is to provide a cooling system that is self regulating such that it automatically absorbs heat from the enclosure without requiring operator intervention. A further object of this invention is to provide a means of cooling an enclosure that only permits the removal of heat from the enclosure and does not allow (with little exception) any heat to enter the enclosure. Yet another object of this invention is to provide a system that is self-regenerative and which does not take up any valuable floor space. Still another object of this invention is to provide a cooling system that enables the enclosure to avoid contact with the ambient environment thereby achieving a clean and relatively dust-free enclosure. These and other objects and advantages of this invention will become obvious upon further investigation.

SUMMARY OF THE INVENTION

This invention pertains to a passive cooling system for cooling an enclosure. It consists of at least one elongated heat pipe having an evaporator side for extension within the enclosure and an opposite condenser side for extension outside the enclosure in contact with the ambient environment. A working fluid is contained within the evaporator side of the heat pipe with this working fluid undergoing a liquid-to-vapor phase change upon the absorption of heat. This system also incorporates a thermal storage device having a portion extending outside but adjacent to the evaporator side of the heat pipe with the remainder of the thermal storage device extending within and along the evaporator side of the heat pipe. A solid-to-liquid phase change material is contained within this thermal storage device with this material undergoing a phase change to liquid upon the absorption of heat. This thermal storage device, strictly speaking, is not a heat pipe per se as the thermal storage device is completely filled with the phase change material. Consequently, no vapor is generated within the thermal storage device as would normally occur within a normal heat pipe. Finally, a manner of insulating the evaporator side of the heat pipe from the condenser side of the heat pipe is installed so as to reduce thermal conduction between the two sides.

BRIEF DESCRIPTION OF THE DRAWINGS

FIG. 1 is a pictorial view of the invention.

FIG. 2 is a pictorial view of the invention as installed along the roof or ceiling of an enclosure.

FIG. 3 is a sectional view, partially cut away, taken along lines 3—3 of FIG. 2.

FIG. 4 is a pictorial view of a further embodiment of the invention incorporating a number of fins thereon to enhance heat collection and rejection.

FIG. 5 is a sectional view taken along lines 5—5 of FIG. 4.

DETAILED DESCRIPTION OF THE PREFERRED EMBODIMENTS

Referring initially to FIG. 1, there is shown passive cooling system 10. System 10 incorporates sealed thermal storage device 12 having a first portion 14 that is in direct contact with the enclosed environment 16 of enclosure 18. A second portion 20 of thermal storage device 12 extends within evaporator side 22 of upwardly inclined heat pipe 24. Generally, thermal storage device 12 will be concentric with heat pipe 24 and will contain commercially available hydrated salt 26 or some other substance that is capable of undergoing a solid-to-liquid phase change at relatively low room temperatures. Generally, hydrated salt 26 will completely fill thermal storage device 12 thereby eliminating any vapor that might develop or accumulate therein.

As can be imagined, evaporator side 22 of heat pipe 24 is located within enclosure 18 while corresponding (and elevated) condenser side 28 of heat pipe 24 is located outside enclosure 18 in contact with the ambient environment 30. It is critical for operation for heat pipe 24 to be inclined upward from evaporator side 22 toward condenser side 28. Also, thermal storage device 12 is sealed such that the hydrated salt 26 contained therein is prevented from mixing with working fluid 32 (generally water, methanol, or ammonia) contained within heat pipe 24. The lower evaporator side of heat pipe 24 is only partially filled with working fluid 32, but the level of working fluid 32 therein is sufficient enough to either fully cover or cover the bulk of second portion 20 of thermal storage device 12. Such partial filling of evaporator side 22 of heat pipe 24 is to enable the heat pipe to operate properly (i.e. to evaporate and condense working fluid 32 so as to respectively absorb and reject heat).

During operation, hydrated salt 26 within thermal storage device 12 absorbs heat Q (see arrows 34) from enclosed environment 16 such as through first portion 14. Such heat Q may be generated from the machinery or equipment (not shown) contained within enclosure 18. As such heat Q is absorbed, hydrated salt 26 undergoes a solid-to-liquid phase change within thermal storage device 12. This absorbed heat Q is then transferred to working fluid 32 in evaporator side 22 of heat pipe 24 via second portion 20 of thermal storage device 12 (see arrows 36). This transferred heat Q causes the evaporation of working fluid 32 within evaporator side 22. Such evaporated working fluid 32 then travels upward to condenser side 28 until this working fluid 32 condenses on the interior walls of condenser side 28. Upon this condensation, heat Q is rejected to ambient environment 30.

Of course, should the temperature of condenser side 28 be greater than the temperature of evaporator side 22, no heat Q can be transferred to condenser side 28 and thus be rejected to ambient environment 30. However, the hydrated salt 26 of thermal storage device 12 is still capable of absorbing and retaining heat Q until such time that this heat Q can be transferred to condenser side 28. Such a situation may arise during day-time hours. However, such a higher condenser side 28 temperature will have no effect on the ability of thermal storage device 12 to continue to absorb heat Q from within enclosure 18 during this time. When the temperature of condenser side 28 once more falls below that of evaporator side 22, heat Q will again be automatically transferred to condenser side 28 for eventual rejection to ambient environment 30.

Since thermal storage device 12 transfers heat Q solely to evaporator side 22, heat pipe 24 acts as a thermal diode by only permitting heat Q to be transferred out of enclosure 18. In the type of heat pipe 24 used here, heat Q is transferred from evaporator side 22 to condenser side 28 via the continuous vaporization and condensation of working fluid 32. This cycle is repeated continuously as long as evaporator side 22 or enclosed environment 16 temperature is greater than condenser side 28 or ambient 30 temperature. When condenser side 28 or ambient 30 temperature is higher than evaporator side 28 or enclosed environment 16 temperature, heat pipe 24 will be at equilibrium. In this situation, heat Q will be prevented from being transferred into or out of enclosure 18. However, a negligible amount of heat will still enter enclosure 18 via conduction through the walls of heat pipe 24.

However, to further thermally isolate condenser side 28 from evaporator side 22, an isolation ring 38 made of any insulating material suitable for this purpose can be added between condenser side 28 and evaporator side 22. This isolation ring 38 will reduce the heat flow via conduction through heat pipe 24 into enclosure 18 (in other words, isolation ring 38 prevents the flow of heat through the walls of heat pipe 24).

From the above, it is evident that heat pipe 24 is of the gravity-assisted thermosyphon type since it does not contain a wick that can pump working fluid 32 via capillary action against gravity. In any event, for operation, evaporator side 22 of heat pipe 24 must be at a temperature higher than condenser side 28 so that working fluid 32 can be evaporated in evaporator side 22 and flow upward to condense in condenser side 28 thereby rejecting any such absorbed heat Q to ambient environment 30. Upon condensation, working fluid 32 returns to evaporator side 22 in a liquid state ready to begin the cycle again.

FIGS. 2 and 3 disclose a different embodiment of cooling system 10 than that disclosed above. In these figures, a bent heat pipe 24 is disclosed rather than simply an inclined one. As shown, the lower evaporator side 22 of this bent heat pipe 24 is positioned within enclosure 18 while the upper condenser side 28 is in contact with ambient environment 30 such as by being inclined along the roof 40 of enclosure 18. In this fashion, no floor space is utilized and evaporator side 22 is located in the warmer or hotter area of enclosed environment 16 (since heat Q from source 42 rises). Of course, a plurality of bent heat pipe 24 can be installed along the ceiling if desired so as to absorb as much heat from within enclosure 18 as possible without occupying any valuable floor space.

FIGS. 4 and 5 disclose an alternate embodiment of the present invention, and one that can also be used in the embodiment of FIGS. 2 and 3. In accordance with FIGS. 4 and 5, extended surfaces 44 in the form of fins are installed along the outside of condenser side 28 of heat pipe 24 and also along first portion 14 of thermal storage device 12. These external fins 44 enhance the heat capture and release from cooling system 10. Also, if desired, second portion 20 of thermal storage device 12 can also be configured with internal fins 46 to enhance the transfer of heat Q from this second portion 20 to working fluid 32 within evaporator side 22 of heat pipe 24. Also, by the use of such fins 44 and/or 46, fewer heat pipe 24 may be required in the embodiment of FIGS. 2 and 3.

Also, as shown in the drawings, all the embodiments would incorporate pressure relief valve 48 so that should the build-up of pressure within heat pipe 24 be too great, such pressure can be safely released without the fear of an explosion.

The advantages of cooling system 10 as described above include the fact that system 10 is a passive system requiring no moving mechanical parts. Thus, maintenance is minimal or non-existent. Also, being passive, no electrical hook-up or power source is required for operation, thus, system 10 may be utilized in remote locations where such power is not available or too costly to supply. Furthermore, by incorporating working fluid 32 and hydrated salt 26, system 10 is self-regenerative since such material merely changes back and forth between its solid/liquid phase (for hydrated salt 26) or liquid/vapor phase (for working fluid 32) depending on its heat content. Additionally, system 10 does not require any floor space for operation thereby freeing up such space for additional equipment or machinery 42. As indicated above, system 10 can be wall or roof mounted. Also, by its configuration, system 10 acts as a thermal diode or one-way valve allowing heat to only be released or removed from enclosure 18 without any heat (or only a negligible amount thereof) being allowed to enter enclosure 18. Furthermore, by this configuration, system 10 enables an enclosure 18 to be cooled without requiring such enclosure 18 to be open or in contact with ambient environment 30.

What is claimed is:

1. A passive cooling system for cooling an enclosure comprising:

(a) at least one elongated heat pipe having an evaporator side for extension within the enclosure and an opposite condenser side for extension outside the enclosure in contact with the ambient environment;

(b) a working fluid contained within said evaporator side of said heat pipe, said working fluid undergoing a liquid-to-vapor phase change upon the absorption of heat;

(c) a thermal storage device having a first portion extending outside and adjacent said evaporator side of said heat pipe and a second portion extending within and along said evaporator side of said heat pipe;

(d) solid-to-liquid phase change material within said thermal storage device, said material undergoing a phase change to liquid upon the absorption of heat; and, (e) insulating means intermediate said evaporator side and said condenser side of said heat pipe for reducing thermal conduction along said heat pipe.

2. The system as set forth in claim 1 wherein said working fluid in said evaporator side of said heat pipe covering all or a major portion of said second portion of said thermal storage device.

3. The system as set forth in claim 2 wherein said thermal storage device is sealed to prevent the mixing of said solid-to-liquid phase change material with said working fluid.

4. The system as set forth in claim 3 wherein said heat pipe is inclined rising upward from said evaporator side to said condenser side.

5. The system as set forth in claim 4 wherein said second portion of said thermal storage device is concentric with said evaporator side of said heat pipe.

6. The system as set forth in claim 5 further comprising a plurality of external fins secured to said first portion of said thermal storage device and a plurality of like fins secured to said condenser side of said heat pipe.

7. The system as set forth in claim 6 further comprising a plurality of internal fins secured to said second portion of said thermal storage device and submerged within said working fluid in said evaporator side of said heat pipe.

8. The system as set forth in claim 5 wherein said heat pipe is bent in a mid-region of its length.

9. The system as set forth in claim 7 further comprising a pressure release valve secured to said condenser side of said heat pipe.

* * * * *